United States Patent [19]

Friend

[11] 3,864,004

[45] Feb. 4, 1975

[54] CIRCUIT BOARD SOCKET

[75] Inventor: Lindsay C. Friend, Camp Hill, Pa.

[73] Assignee: E. I. du Pont de Nemours and Company, Wilmington, Del.

[22] Filed: Nov. 30, 1972

[21] Appl. No.: 310,871

[52] U.S. Cl. ........ 339/258 R, 339/17 R, 339/275 B

[51] Int. Cl. .......................... H01r 13/12, H01r 9/06

[58] Field of Search ............ 339/17 R, 17 C, 275 R, 339/275 B, 275 C, 275 T, 258 R, 258 P

[56] References Cited

UNITED STATES PATENTS

| | | | |
|---|---|---|---|
| 2,830,278 | 4/1958 | Schwarz | 339/17 R |
| 2,969,517 | 1/1961 | Gluck | 339/17 C |
| 3,031,635 | 4/1962 | Gluck | 339/275 B X |
| 3,156,517 | 11/1964 | Maximoff et al. | 339/275 B |
| 3,163,709 | 12/1964 | Fox | 339/275 B X |
| 3,222,632 | 12/1965 | Fuller | 339/275 R X |
| 3,230,297 | 1/1966 | Means | 339/17 R X |
| 3,249,910 | 5/1966 | Venn et al. | 339/275 B X |
| 3,506,942 | 4/1970 | Alimena | 339/17 R |
| 3,631,373 | 12/1971 | Matrisian | 339/17 R X |
| 3,634,879 | 1/1972 | Longnecker et al. | 339/275 B X |
| 3,681,744 | 8/1972 | Olsson | 339/17 C X |
| 3,686,625 | 8/1972 | Krehbiel et al. | 339/275 B |
| 3,796,988 | 3/1974 | Palombella | 339/275 B |

*Primary Examiner*—Roy D. Frazier
*Assistant Examiner*—Lawrence J. Staab
*Attorney, Agent, or Firm*—Thomas Hooker

[57] ABSTRACT

A circuit board socket of the type having a socket body with a disconnect spring within the body. The inner surface of the body is solder resistant and prevents solder flooding of the socket.

6 Claims, 5 Drawing Figures

PATENTED FEB 4 1975 3,864,004

CIRCUIT BOARD SOCKET

The invention relates to an improved circuit board socket of the type disclosed in U.S. Pat. Nos. 3,681,738 and 3,681,744, both of which are assigned to the assignee of the present invention. The above patents disclose small circuit board sockets which are fitted in holes through the thickness of circuit boards and then soldered in place to form an electrical connection between disconnect contact springs in the sockets and circuitry on the board. These sockets use drawn bodies which prevent solder from wicking through the socket wall and into the spring area.

Conventional circuit board sockets include bodies having body seams. During soldering the molten solder wicks through these body seams and into the contact area thus preventing the use of the socket as a disconnect.

The object of the invention is to provide an improved circuit board socket of the type having a socket body and a disconnect spring confined within the interior of the body. The exterior surface of the body is solder adherent while the interior surface of the body is solder resistant so that molten solder will not adhere to the interior surface. Thus, during soldering molten solder does not flow along the socket interior. In the disclosed embodiment the spring includes a contact tab which extends through a slot in the socket body. Protection against solder wicking along the tab is provided by application of a solder resist on the adjacent portion of the spring.

Other objects and features of the invention will become apparent as the description proceeds, especially when taken in conjunction with the accompanying drawings illustrating the invention, of which there is one sheet.

IN THE DRAWINGS

Figures 1, 2, 3, 4, 5:
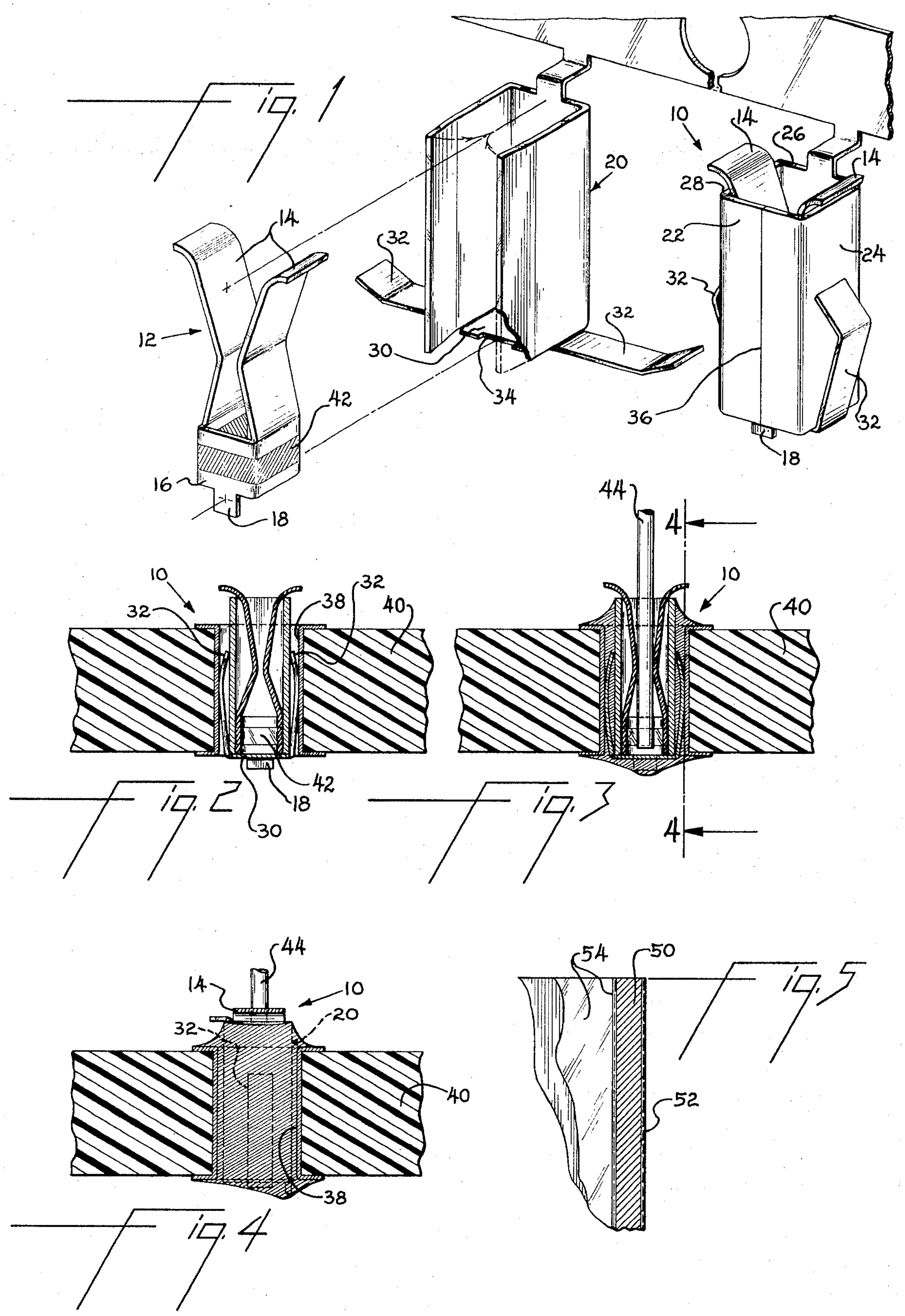
FIG. 1 is a partially exploded view illustrating circuit board sockets according to the invention.
FIG. 2 is a sectional view taken through the socket after insertion into a circuit board hole.
FIG. 3 is a similar view to FIG. 2 after soldering and insertion of a lead into the socket.
FIG. 4 is a view taken along line 4—4 of FIG. 3.
FIG. 5 is a sectional view taken through the thickness of material forming a socket body according to the invention.

As illustrated in FIG. 1, the circuit board socket 10 includes a spring 12 having a pair of inwardly bowed contact arms 14 joined together by a U-shaped member 16 located at the bottom of the spring. Solder tab 18 extends outwardly from portion 16. Socket body 20 is rectangular in transverse section, is folded from sheet metal stock and includes four flat side walls 22, 24, 26 and 28 and a folded up bottom 30. The bottom joins the lower portion of sidewall 26. A body seam, defined as a seam between closely adjacent portions of the body 20, extends around three sides of the base 30 and along the middle of side 22.

A pair of hole-engaging outwardly bowed spring arms 32 extend from opposite sides of bottom 30 and are bent up against sides 24 and 28. The spring 12 is confined in socket body 20 with U-shaped portion 16 resting on socket bottom 30 and the upper ends of spring arms 14 folded over the upper edges of socket body sides 24 and 28. Tab 18 extends through slot 34 in bottom 30.

Body 20 is preferably formed from aluminum. The exterior surface of the body is provided with a solder adherent coating so that molten solder will adhere to it. The coating may, for example, be an electroless nickel plating. Other coatings may be used. Solder does not adhere to or wet the naturally occurring aluminum oxide on the interior surface of the body.

Solder will adhere to the surface of spring 12. A solder resist coating 42 is provided on both sides of U-shaped portion 16 in order to assure that any molten solder wicking through the seam at tab slot 34 does not flow up on to spring arms 14 and thereby adversely affect the disconnect contact properties of the socket.

FIG. 2 illustrates socket 10 inserted into a plated circuit board hole 38 extending through the thickness of circuit board 40. The body spring arms 32 are compressed and hold the socket in place prior to the soldering operation. FIG. 3 is similar to FIG. 2 but illustrates the socket and board after soldering. The molten solder adheres to the exterior side walls of body 20 and thus wicks up the circuit board hole to the top of the board as illustrated. The solder forms an electrical connection between the circuitry on the board and the solderable spring tab 18 which projects below the socket bottom 30.

Because the interior surface of the socket 20 is solder resistant, molten solder does not flow into the interior of the socket through the body seams in body 20. A slight amount of solder may wick along the seams at tab 18 and onto the bottom surface of the U-shaped portion 16 of the spring. However, solder resist 42 and the solder resist socket interior prevent such solder from flooding the socket or flowing into the contact area on arms 14.

FIG. 3 illustrates a lead 44 inserted into the socket 10 after the socket has been soldered to the board 40. The lead forces the spring arms apart so that a reliable electrical connection is formed between the lead and the circuitry on the board 40.

While the body 20 may be formed of aluminum as described with a solder resistant aluminum oxide coating on the interior surface of the body and solder adherent coating on the exterior surface of the body, it is not intended that the invention be limited to such a body. Alternatively, the body 20 could be formed from solder adherent metal such as brass, in which the interior surface of the body has been coated with a solder resist such as a chrome plate or any of a number of commercially available resists, whether plated, organic or otherwise. Accordingly, the invention relates to a circuit board socket having an opening or body seam exposed to molten solder in which the inner surface of the body is solder resistant to prevent solder from flooding the socket. The outer surface of the body is preferably solder adherent to assure proper soldering to the circuit board.

FIG. 5 illustrates a section taken through a side of a socket body 50 according to the invention. The exterior surface 52 is solder adherent while the interior surface 54 is solder resistant. The body 50 may be made of any suitable material, preferably a metal, although in some instances a non-metal body may be used.

In some socket configurations, including that of U.S. Pat. No. 3,681,738, it is not necessary for a portion of the spring to extend through the thickness of the body directly in the area exposed to molten solder. An M-shaped contact spring as disclosed in Pat. No.

3,681,738 can be used with a socket body of the type disclosed herein with the inner legs confined in the body for disconnect engagement with a lead inserted into the body through the lead-receiving opening and the outer legs extending along the outside surface of the body to establish an electrical connection with the circuit board.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A two part circuit board socket comprising an elongate hollow body having a generally rectangular transverse cross section and a lead contact spring; said body including four longitudinally extending, generally flat sides joining each other at corners and a flat rectangular bottom member oriented at right angles to the central longitudinal axis of the body, the ends of said sides defining generally rectangular openings at both ends of the body, said bottom member joining one of said sides at an end thereof and extending perpendicularly away therefrom with the edges of the bottom member adjacent the ends of the other three body sides to close the adjacent rectangular opening, a body seam extending longitudinally along a second side opposite said one of said sides between adjacent corners of the second side and a body seam extending around the edges of the bottom member; and an integral lead contact spring including a pair of elongate opposed spring arms formed from flat sheet metal stock, said arms being positioned within the interior of said body and extending along opposed body sides, a spring portion connecting ends of said spring arms together, the medial portions of said arms being spaced closely adjacent each other whereby a lead inserted into the body through the open end thereof contacts the medial portions and spring contact means extending through an opening in the body and outwardly of the body for establishing a soldered electrical connection with circuitry on the circuit board; said body including a solder adherent exterior surface and a solder resistant interior surface at the body seams.

2. A two part circuit board socket as in claim 1 wherein said spring contact means includes a solder resistant surface located within the body adjacent the arms.

3. A two part circuit board socket as in claim 1 including a chrome plate on the interior surface of the body at said body seams.

4. A two part circuit board socket as in claim 1 wherein said body includes a pair of spring arms joining the body at the closed end and extending along the outer surfaces of opposed body sides for confining the circuit board socket in a circuit hole prior to soldering.

5. A two part circuit board socket including an elongate hollow socket body with an open end and a closed end, a pair of exterior spring arms joining the body at said closed end and extending therefrom along opposite sides of the body, said arms being bowed outwardly of the body for securing the body in a circuit board hole prior to soldering, a longitudinal body seam extending the length of the body from the open end to the closed end, a body seam extending across each exterior spring arm at the junction with the body at the closed end; and a spring metal contact member located within the body for engaging a lead inserted into the body through the open end, said member including a solder contact on the outside of the body and a portion extending through an opening in the body connecting said solder contact and said member; and a solder resistant surface on the interior of said body adjacent said seams to prevent molten solder from flowing through the seams and into the interior of the body.

6. A two part circuit board socket comprising an elongate hollow body having a generally rectangular transverse cross section and a lead contact spring; said body including four longitudinally extending generally flat sides joining each other at corners and a generally flat bottom member oriented at right angles to the central longitudinal axis of the body, said sides defining openings at both ends of the body, said bottom member joining one of said sides at an end thereof and extending perpendicularly away therefrom to close the adjacent opening, a body seam extending longitudinally along a second side between the adjacent corners and around the edges of the bottom member; and an integral lead contact spring including a pair of elongate opposed spring arms formed from flat sheet metal stock, said arms being positioned within the interior of said body and extending along opposed body sides, a spring portion connecting ends of said spring arms together, the medial portions of said arms being spaced closely adjacent each other whereby a lead inserted into the body through the open end thereof contacts the medial portions and spring contact means extending through an opening in the body and outwardly of the body for establishing a soldered electrical connection with circuitry on the circuit board.

* * * * *